United States Patent [19]

Giedd et al.

[11] Patent Number: 5,753,523
[45] Date of Patent: May 19, 1998

[54] METHOD FOR MAKING AIRBRIDGE FROM ION-IMPLANTED CONDUCTIVE POLYMERS

[75] Inventors: Ryan E. Giedd, Springfield; Mary G. Moss, Rolla; James Kaufmann, Newburg; Terry Lowell Brewer, Rolla, all of Mo.

[73] Assignee: Brewer Science, Inc., Rolla, Mo.

[21] Appl. No.: 342,865

[22] Filed: Nov. 21, 1994

[51] Int. Cl.⁶ .................................... H01L 24/84
[52] U.S. Cl. ............... 437/18; 437/18; 437/20; 437/37; 437/47; 437/228; 437/927
[58] Field of Search ............... 437/1, 8, 18, 20, 437/37, 47, 225, 226, 228, 231, 918, 927, 931, 934; 427/525

[56] References Cited

U.S. PATENT DOCUMENTS

| | | | |
|---|---|---|---|
| 4,456,522 | 6/1984 | Blackburn | 437/927 |
| 4,511,445 | 4/1985 | Forrest et al. | 204/158 HE |
| 4,849,071 | 7/1989 | Evans et al. | 437/927 |
| 4,994,401 | 2/1991 | Ukai | 437/40 |
| 5,250,388 | 10/1993 | Schoch, Jr. et al. | 430/269 |

FOREIGN PATENT DOCUMENTS

| | | |
|---|---|---|
| 0042366 | 4/1981 | Japan . |
| 59-186365 | 10/1984 | Japan . |
| 8025505 | 5/1988 | Japan . |
| 1005019 | 1/1989 | Japan . |
| 0205536 | 8/1989 | Japan . |

OTHER PUBLICATIONS

Masaaki, Iizuka et al. "Electrical and Optical Investigations of Carbon Clusters Formed in Organic Films By Ion Implantation", Nucl. Instrum. Methods Phys. Res., Sect. B (1993), B 80–81 (Pt2), 1072–5.

Masaaki, Iizuka, "Fabrication and Characterzation of Modified Layer in Ion Implanted Organic Film", Mr. Cyst. Liq. Cryst. Sci. Technec., Sect A (1994), 247, 173–8 Issn 1058–725 x.

Primary Examiner—Charles L. Bowers, Jr.
Assistant Examiner—Matthew Whipple
Attorney, Agent, or Firm—Peoples & Hale; Veo Peoples, Jr.; J. William Stader

[57] ABSTRACT

Organic films are applied from solvent solution to a substrate, then are ion implanted to have resistivity in the kilohm/square to gigaohm/square range. The films are then patterned by standard lithographic procedures, with surprisingly little loss of conductivity, in spite of contact with organic solvents or acidic or basic etchant solutions during the patterning process. Both structures which contact the substrate, and freestanding conductive polymer bridges, can be formed. The invention provides a method of producing electrical devices which does not require the use of single crystal semiconductor substrates or deposition of inorganic semiconductors. The resulting devices are highly resistant to damage from abrasion, solvents, acids, bases, and moisture.

1 Claim, 5 Drawing Sheets

METHOD FOR MAKING AIRBRIDGE FROM ION-IMPLANTED CONDUCTIVE POLYMERS

FIELD OF THE INVENTION

The United States Government has a paid-up license in this invention and the right in limited circumstances to require the patent owner to license others on reasonable terms as provided for by the terms of Contract Number DAAL03-92-C-0017, awarded by the Ballistic Missile Defense Organization, and Grant Number III-9362010, awarded by the National Science Foundation.

This invention relates to a method of producing small geometry electrical components from conductive polymer films, and particularly from ion implanted polymer films.

BACKGROUND OF THE PRIOR ART

The integrated circuit (IC) industry is based upon silicon or, to a lesser extent, other inorganic semiconductors such as germanium or Group III–V compounds. To produce wafers for IC production, a single crystal of silicon is grown; sections are removed by slicing and are then polished to produce a high degree of surface uniformity. The single crystal silicon wafer is then patterned and processed by ion implantation, diffusion, etching, metallization, etc., to produce the wide variety of electrical devices which are in use today.

In some applications (for instance, if the single crystalline substrates are too optically dense, too small, too expensive, or too inflexible), it is desirable to deposit the semiconductive layer on glass or plastic for device fabrication, rather than to use a single crystal silicon substrate. Additionally, if multiple layers of circuitry are required, the semiconductor must be deposited on top of previously processed layers. Often in these cases, polysilicon is deposited in a chemical vapor deposition (CVD) process. While widely in use, CVD processes require the use of hazardous gases such as silane, and extensive environmental controls are necessary to use these processes in manufacturing. In addition, polysilicon deposition is not feasible on some substrates because of the high temperatures required in the process.

With the increasing complexity of circuits and the advent of new technologies such as micromachining, new processes for the deposition of multiple layers of circuitry are required. In some cases, the ability to choose a substrate other than single crystal silicon is important. For instance, large-size silicon wafers are highly expensive and difficult to handle. The liquid crystal display industry requires that devices be processed on glass because of the transparency requirement.

Conducting polymers, spun onto a variety of substrates, have been investigated as a potential means for producing electrical devices on alternative substrates, or for fabricating multiple levels of circuitry.

One of the first examples of a transistor made from conductive polymers was reported by J. H. Burroughs, C. A. Jones, and R. H. Friend, "New semiconductor device physics in polymer diodes and transistors", in *Nature*, volume 335, p. 137 (1988). Burroughs, et al., produced transistors made of spincoated polyacetylene, but all processing and measurement was necessrily carried out in the absence of oxygen because of instability of the polyacetylene.

Transistors have been reported which have been fabricated from polythiophene and its derivatives. The photolithographic patterning of polythiophene is described by W. Kobel, H. Kiess, and M. Egli, in "Generation of micropatterns in poly(3-methylthiophene) films using microlithography: A first step in the design of an all-organic thin-film transistor", in *Synthetic Metals*, volume 22, p. 265 (1988).

A report in *Semiconductor International* (January 1993, p. 26) describing field effect transistors made with conductive polymers states that the most promising polymers are chemically "doped" electroactive polymers from one of four categories: polythiophenes, polyarylene vinylenes, polyanilines, and polypyrroles. All of these polymer types are made conductive by chemical "doping" with oxidizing or reducing agents. As a result, their conductivities can be easily changed by exposure to reactive chemicals which can reverse the doping effects.

For instance, the conductivity of poly(3-hexyl thiophene) was found to degrade upon exposure to ammonia gas, as well as air (A. Assadi, G. Gustafsson, M. Willander, C. Svensson, and O. Inganas, "Determination of field-effect mobility of poly (3-hexylthiophene) upon exposure to $NH_3$ Gas", in *Synthetic Metals*, volume 37, p. 123 (1990)).

The formation of conductive polymer films by ion implantation of insulating polymers is a well-known phenomena. Ion implantation is used to "dope" inorganic materials in order to control conductivity. (See, for example, U.S. Pat. No. 4,759,836, Jul. 26, 1988.) However, the mechanism by which conductivity is induced in organic materials by implantation is not well understood, and is believed to be the result of physical changes rather than the result of chemical interactions which occur when inorganic materials such as silicon are doped.

U.S. Pat. No. 4,491,605, "Conductive polymers formed by ion implantation," teaches the use of rigid backboned polymers such as polyphenylene sulfide to form conductive films by ion implantation. These films are spincoated onto substrates prior to implantation, but the solutions and substrate must be heated during coating because these types of polymers are only sparsely soluble. The resulting films have a relatively low conductivity, $10^{-3}$ (ohm centimeters)$^{-1}$, requiring interdigitated electrodes for measurement of resistance. These films were not patterned by photolithography.

Hioki, et al., in 1993, disclosed that the dominant effects of ion implantation on polyimide (commonly referred to as Kapton H) were decomposition and carbonization of the polymer. The decomposition and carbonization of Kapton H were induced at temperatures well below the temperature at which vacuum pyrolysis begins. This resulted in a conductivity increase (or conversely, a resistivity decrease) by twenty orders of magnitude and was suggested to arise primarily from radiation damage in the polymer induced by incident energetic ions. Although neither the ability of the ion-implanted polymer to maintain a consistent electrical responsiveness during repeated heating cycles, nor its ability to maintain a consistent sheet resistivity during prolonged exposure, at temperatures which would intrinsically damage the polymer, were tested, it was determined that the conductivity increase was dependent on polymer damage. This suggests that as the polymer approaches phase transitions such as the glass transition temperature, the electrical responsiveness, which stems intrinsically from the ion implantation, would deviate as a consequence of thermal degradation. (See "Electrical and optical properties of ion-irradiated organic polymer Kapton H", *Applied Physics Letters*, volume 43, p. 30, 1983.)

Giedd, et al., in 1989, disclosed that for ion-implanted polymers where the base polymer was a poor thermal conductor such as polyethylene terephthalate (PET), a steep resistance-temperature relationship at room temperature rendered the ion-implanted materials useful as precise temperature sensors near room temperature. The tests were conducted at well below the 300° C. glass transition temperature ($T_g$) of the polymer. They point out at page 5 that as the PET materials reach their glass point temperature during the process of implantation, they do not yield usable materials. Thus, only high $T_g$ polymers could be used. This work was performed on freestanding films of polymer, rather than films which were cast onto a substrate. See "Electronic Properties of ion implanted polymers", *Proceedings of the Materials Research Society*, volume 147, 1989.

Giedd, et al., in 1991, disclosed stable resistivities in ion-implanted polyacrylonitrile when cycled between –213° C. and 127° C., thus suggesting useful temperature sensors at as high as 127° C. Although the particular polyacrylonitriles are not identified, the 127° C. is slightly above the glass point transition of several polyacrylonitriles. However, no difference in morphology was detected during the thermal cycles and it was disclosed that a stable resistivity is not possible if the physical morphology of the material changes after thermal cycling. The dependence of resistivity on frequency response was suggested to be evidence of a "hopping" mechanism for conduction. This "hopping" of charge carriers from one graphitic region in the implanted polymer to another region, according to theoretical models, would render the resistivity stemming from such "hopping" to be highly dependent upon the temperature. Temperature dependence of ion-implanted polymers is measured as a function of the conduction which occurs during "hopping". See "Temperature sensitive ion-implanted polymer films", *Nuclear Instruments and Methods in Physics Research*, volume B59/60, p. 1253, 1991.

Wang, et al., disclosed, in January, 1993, the details of composite conduction in ion-implanted polymers. This result confirmed variable "hopping" ranges in conductivity. See Y. Wang, et al., "Modification of high temperature and high performance polymers by ion implantation", *Journal of Materials Research*, volume 8, p. 1, 1993.

While ion implanted organic polymer films have been investigated for research purposes, until now little work has been done to utilize the films as electrical devices. In fact, to produce effective electrical components from such films requires a particular set of properties, including homogeneous film quality on a small scale, resistance to the solvents and etchants encountered during patterning, thermal stability, and ambient stability of the resistance imparted during implantation. It has not been immediately apparent that organic polymer films, when implanted, will have these properties.

The fibrous nature of an implanted film has been disclosed by Wang, et al. (C. S. Wang, C. Y-C Lee, and F. E. Arnold, "Ion Implantation of Rigid-rod and Ladder Polymers for Improved Electrical Conductivity", *Polymer Materials and Science Proceedings*, volume 66, p. 291, 1992). Considerable surface structure greater than 3 micrometers was seen in implanted polymer films of rigid-rod and ladder polymers. These polymers were disclosed to be thermally stable in the unimplanted form, but stability data of implanted polymers was not given. Furthermore, these polymers were not soluble enough for spincoating onto substrates, and had to be cast onto glass frits from very dilute solution.

J. Davenas, et al., have suggested the use of ion implanted polymers in microelectronics applications. However, they do not specify whether their research was conducted on freestanding films or on films attached to a substrate. In our experience, a combination of the right conditions is required in order to achieve stable, micron-sized patterns in films on a substrate. In addition, they teach that heterocyclic rings are necessary to cause conductivity after ion implantation, and that PMMA (Polymethylmethacrylate) is not conductive after implantation. ("Role of the Modifications induced by ion beam irradiation in the optical and conducting properties of polyimide", in *Nuclear Instruments and Methods in Physics Research*, volume B32, p. 136 (1988)).

Xu, et al., suggest the use of ion implanted polyimide films as temperature sensors. They chose polyimide for this work because of its thermal stability, and they teach the use of films which are 1 micrometer in thickness. See *Review of Scientific Instruments*, volume 63, p. 202, 1992.

Jenekhe and Tibbets have reported spacially selective enhancement of the conductivity of a ladder-type polymer, BBL. They discuss the production of small geometry conductive regions in this polymer by implantation through metal masks which have been micro-lithographically defined. Their experiments were conducted using freestanding thin films. Implanted films were not patterned on the substrate, and stability is not measured. Also, they teach the use of a highly thermally stable polymer to avoid damage due to sample heating during bombardment. See "Ion implantation doping and electrical properties of high-temperature ladder polymers", *Journal of Polymer Science: Part B: Polymer Physics*, volume 26, pp. 210–209 (1988).

The fabrication of packaged electrical devices involves harsh chemical and thermal processing steps which are not compatible with many organic films.

The first step in the production of small geometry patterns is to spincoat photoresist on top of the film to be patterned. The photoresist is spun from an organic solution containing effective solvents such as methyl cellosolve acetate or ethyl lactate. Such solvents must not attack the underlying film which is to be patterned.

Considerable thermal stability is required because all spin-coating processes require a subsequent bake to evaporate solvent from the film. Unless the conducting polymer film can withstand the short-term bake temperatures of 100°–150° C., it will be destroyed during these solvent evaporation steps.

Next, the photoresist is imaged with ultraviolet light, then developed in aqueous base solution (for positive photoresist) or organic solvent (for negative photoresist). Also problematic is how to prevent the development process from altering the electrical resistance of the underlying film as development proceeds.

Then, the developed pattern is transferred to the conducting polymer layer by plasma etching; during this process, the conducting polymer film must etch in a total time which is less than the etch time of the photoresist etch mask.

TABLE A

| Film | Etchant |
| --- | --- |
| Aluminum | Phosphoric/nitric/acetic acid |
| Chromium | Ceric ammonium nitrate/acetic acid/water |
| Glass | Hydrofluoric acid |
| Gold | Potassium iodine/iodine or aqua regia |
| Indium oxide | Hydrochloric acid |
| $SiO_2$ | Hydrofluoric acid |
| Copper | Ferric Chloride |
| Silicon | 30% potassium hydroxide |

The conducting polymer film could be exposed to any of the etchant solutions listed in Table A, depending upon the subsequent required processing steps. Therefore, the more of these etchants that the film can withstand, the more desirable the film will be as an electrical device because such versatility allows compatibility with a wider variety of materials and processing procedures.

Eventually, the photoresist is removed with acetone or another appropriate solvent.

The final step in the production of an IC which is often neglected in research reports is the die attach process, in which the substrate is cut into individual die, electrical leads are attached, and the entire assembly is secured into a package using thermally cured epoxy glue. During this final process, the film is exposed to high-speed jets of cooling water which can cause adhesion loss, epoxy fumes, and high temperatures.

It is not immediately apparent that a film of organic material, when ion implanted, would have the required film quality, chemical resistance, thermal stability, and etchability, in addition to the ability to survive the above-described harsh processes without appreciable loss of conductivity. Such an easily processed, easily deposited semiconductive film which could be patterned to form highly solvent and abrasion resistant devices on a variety of substrates would be a giant step forward in the IC industry.

SUMMARY OF THE INVENTION

We have discovered that the most desirable organic materials for ion implanted devices are copolymers of styrene and nitrile-containing monomers, such as poly(styrene-co-acrylonitrile) (PSA) or poly(styrene-co-methacrylonitrile), both abbreviated PSA, but they are soluble in the unimplanted form in solvents that are routinely used to dissolve photoresist. Therefore, spincoating photoresist on top of the unimplanted film completely removes the underlying film of this polymer. Although ion implanting the film prior to spincoating the photoresist might cure this problem, the use of a film which is too thick results in blisters during the solvent removal bakes and the implanted film has poor adhesion and lifts off in developer. However, we have found that the proper thickness of an ion-implanted film is undamaged by the spincoating solvent.

Furthermore, the thermal stability of an ion-implanted PSA film is not necessarily expected to be sufficient to withstand baking without substantial resistance change. The unimplanted PSA has a glass transition (softening) temperature of 115° C., which is approximately that of the bake temperature of photoresist. Prior art teaches that the resistance of the implanted film is expected to be less thermally stable than a polymer which has a higher glass transition temperature, such as polyimide. Surprisingly, we have found the opposite to be true; the PSA films have better thermal stability, although both PSA and polyimide polymers can withstand the photoresist bake step when implanted.

A further unexpected result is that the conductivity of an ion-implanted polymer film is not appreciably changed by the solvents and etchants which are encountered during photolithographic processing. Conductivity in implanted films was commonly believed to proceed through a hopping process. As a result, conductivity was expected to be highly dependent upon absorbed impurities such as solvents, acids or bases which are taught to cause reorientation. We have found that the conductivity of ion-implanted films is not this sensitive.

For example, most conductive polymers rely on a chemical doping process to impart conductivity, which in turn renders the polymer susceptible to chemically interactive attack from solvents, acids, or bases. That is, polyaniline is doped by acidification; thus, aqueous basic developer solutions will cause dedoping. Polypyrrole, polyacetylene, and poly(phenylene vinylene) type classes of conducting polymers are doped using Lewis acids and therefore are not expected to be resistant to acids and bases. This is not to say that these materials cannot be patterned, but separate passivation steps must be added, which limit resolution. Even then, certain etchant steps involving strong acids and bases will irreversibly damage the films. Nevertheless, the ion-implanted films have been found to be much more inert than these other classes of conductive polymers.

A further advantage of the implanted polymer films is their dimensional stability and abrasion resistance. These properties, in addition to the acid resistance, enable the production of freestanding air bridges with geometries less than 20 micrometers, and extend their applications in the surface micromachining industry.

It is therefore an object of the present invention to use polymers which have been made conductive by ion implantation to make small geometry electrical components which have a high degree of chemical resistance (to acids, bases, and solvents), as well as a high degree of abrasion resistance.

In accordance with the present invention, small-geometry resistor components and arrays of small geometry resistors are produced from ion-implanted films. The resistance-temperature response of these resistors is unusually steep. The ion-implanted polymer resistors can therefore be used as high-value electrical resistive components, and as transducers where the property sensed is resistance (such as resistance-temperature detectors).

If desired, the patterning process can be extended to include the production of freestanding bridge structures and three-dimensional cavities.

(Drawings are not to scale; dimensions are given below.)
 41. Glass substrate, 1 mm thick
 42. Ion implanted polymer film, 0.1 micrometer thick
 43. Gold leads, separated by 30 micrometers
 44. Photoresist, 1 micrometer thick, 5 micrometers wide, separated by 25 micrometers

Description of 4A–4K 4A,4G Shows glass substrate coated with uniform film of implanted polymer (side and top views)

4B,4H Gold is evaporated (300–400 Å thick) and removed to form strip of exposed implanted polymer.

4C,4I Photoresist is spincoated, exposed through a mask, and developed to provide narrow photoresist stripes perpendicular to the gold strips.

4D,4J Implanted polymer film has been removed by reactive ion etch in areas where there is not photoresist or gold.

4F,4K Glass is etched with hydrofluoric acid revealing freestanding bridges. Photoresist is removed.

Figure 5:
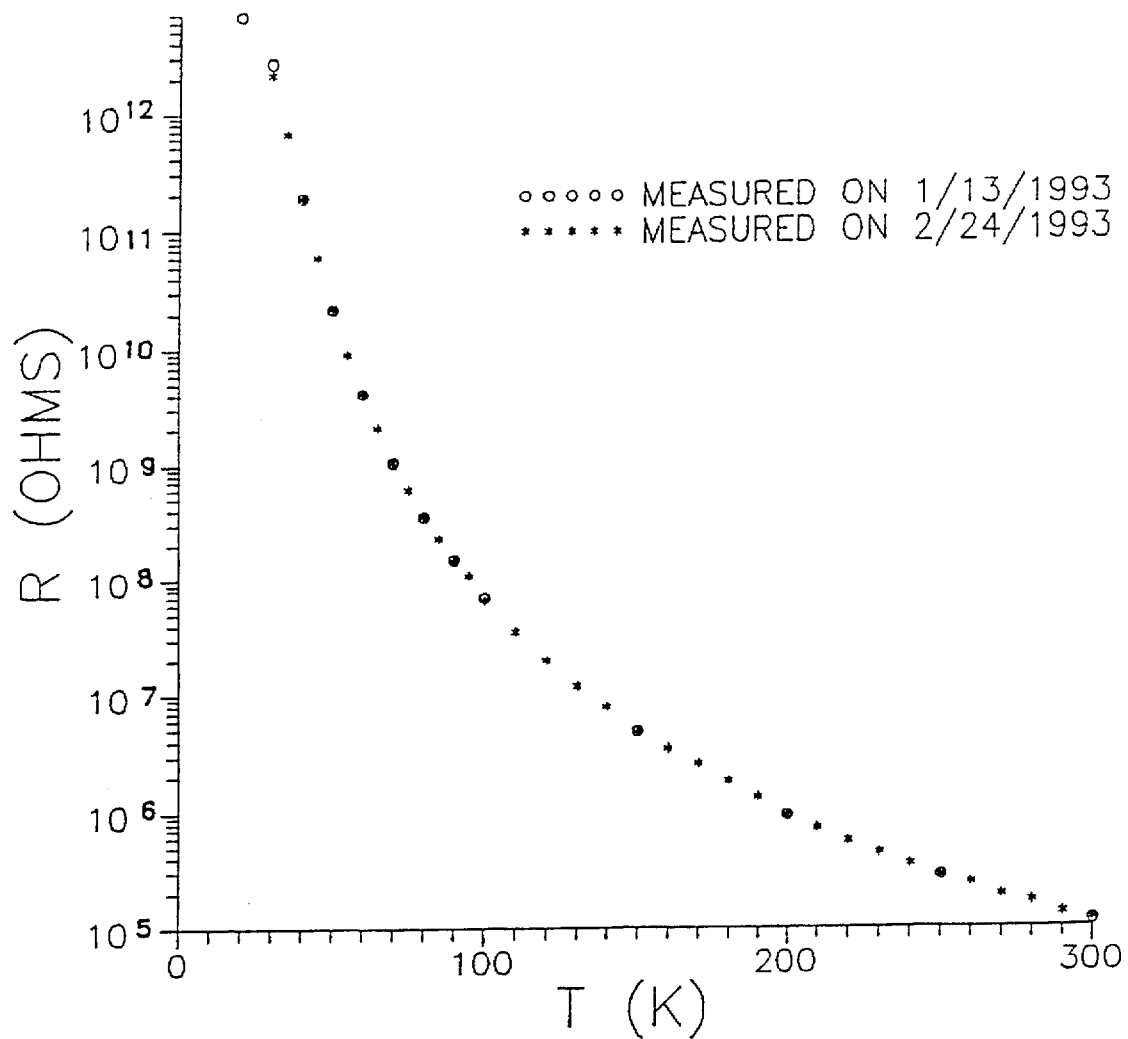

FIG. 5 is a graph showing the dependence of the resistance on the temperature of a poly(styrene-acrylonitrile) film implanted with nitrogen ions to a fluence of $5 \times 10^{16}$ ions/cm$^2$, over the temperature range from room temperature to 30 Kelvin, and the same curve measured at a later time interval.

Figure 6:
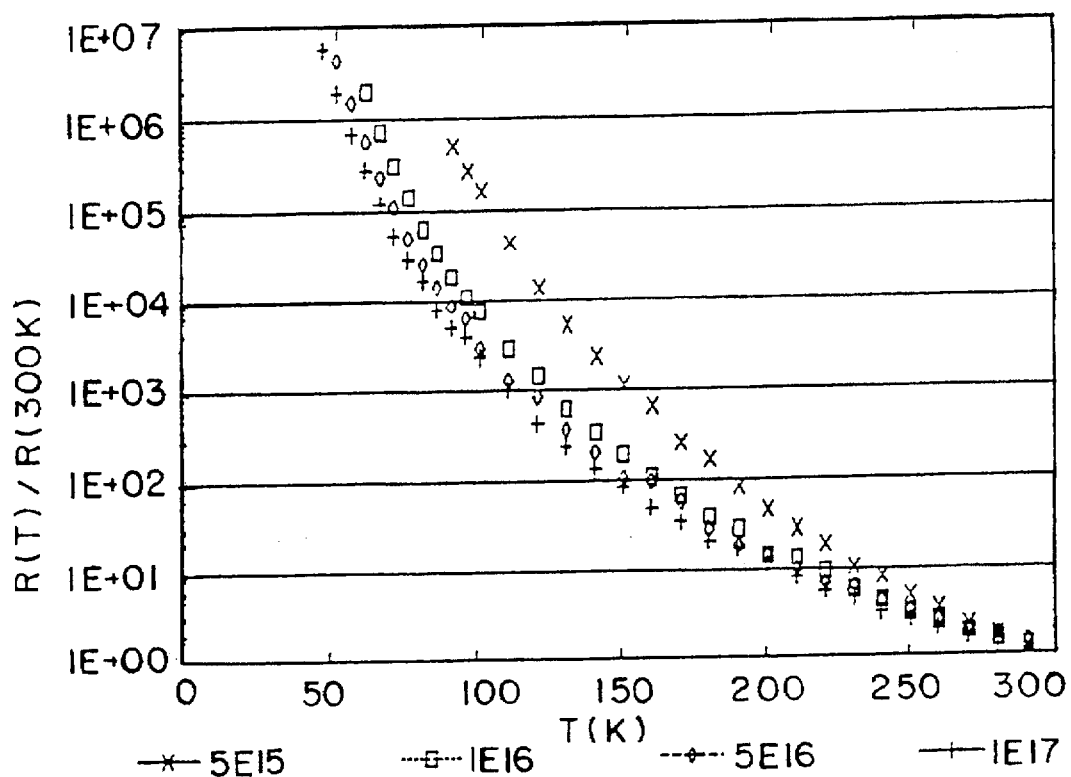

FIG. 6 is a graph showing the temperature dependence of the resistance for films of poly(styrene-acrylonitrile) implanted with varying fluences.

Figure 7:
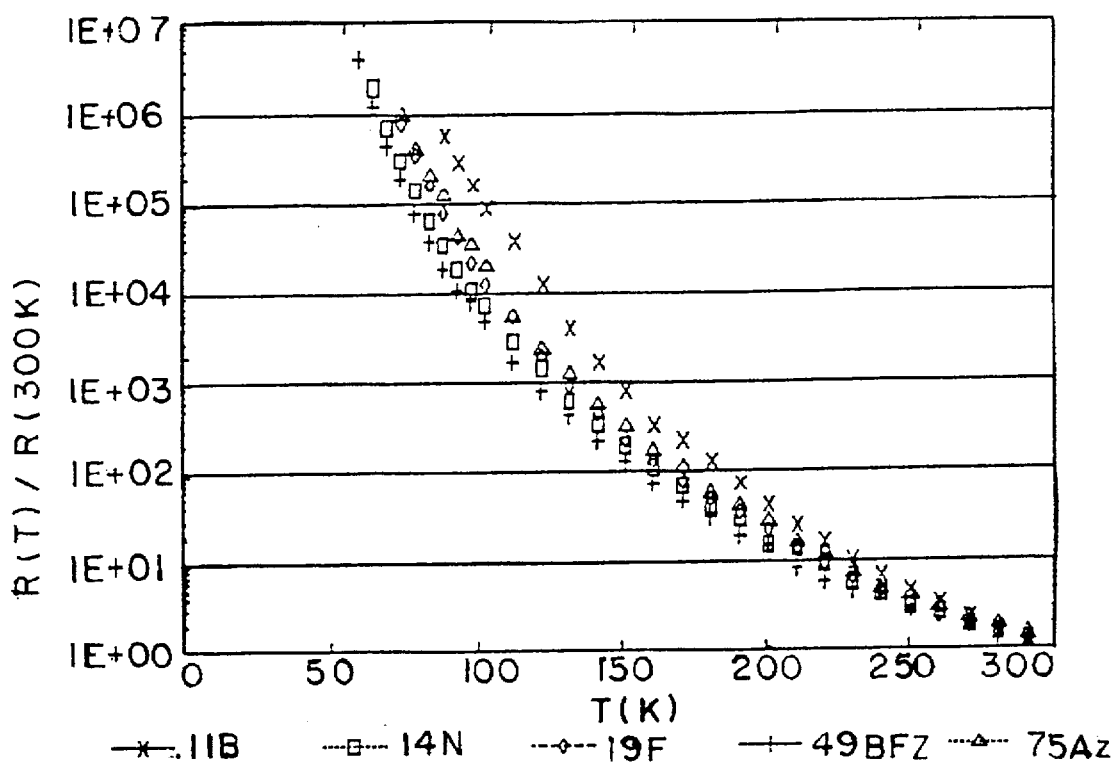

FIG. 7 is a graph showing the temperature dependence of the resistance for films of poly(styrene-acrylonitrile) implanted with different positive ions.

DETAILED DESCRIPTION OF THE INVENTION

Figure 1:
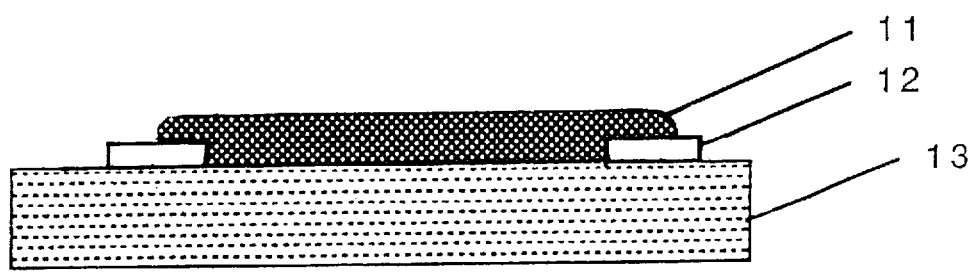
FIG. 1 is a cross-sectional view of a single ion-implanted conducting polymer resistor, referred to here as a "contact resistor", because the conducting polymer material remains in contact with the substrate. The features are numbered as follows: 11, implanted polymer layer; 12, metal electrical connections; 13, substrate.
Figure 2:
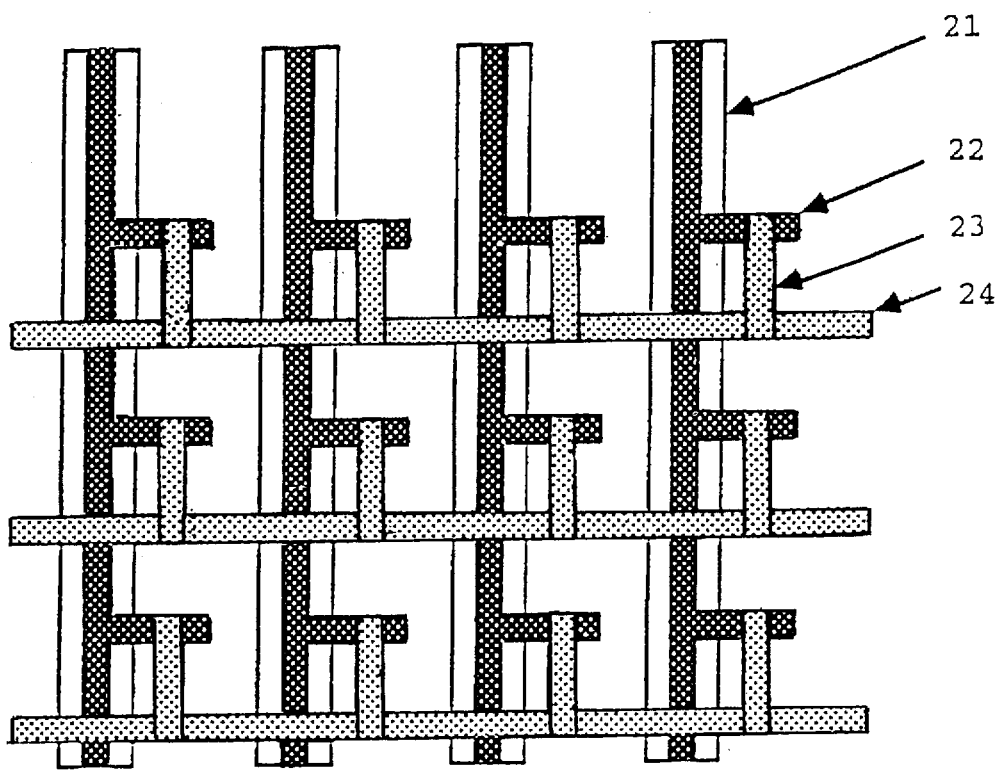
FIG. 2 is a diagram of a 16- element resistor array formed from lithographically patterned polymer films made conductive by ion implantation, with the following elements: 21, nitride insulation covering 22; 22, metal electrical connection; 23, patterned polymer resistor; 24, metal electrical connection.
Figure 3:
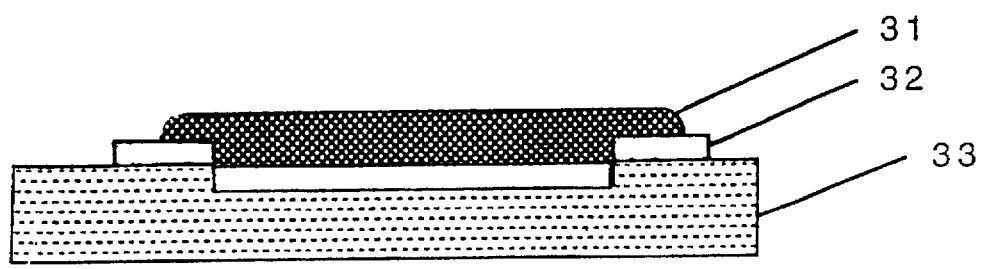
FIG. 3 is a diagram showing a freestanding conductive polymer air bridge, which is a contact resistor which has been released from the substrate in the area in between electrical contacts. The elements are numbered as follows: 31, implanted polymer layer; 32, metal electrodes; 33, substrate.
Figure 4A:
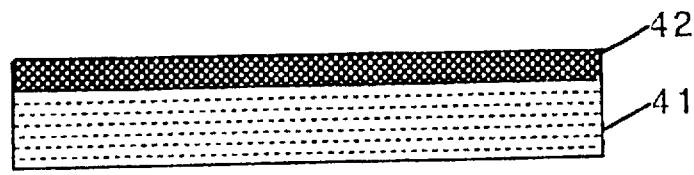
FIG. 4A–4K is a schematic diagram showing the patterning process required to form freestanding conductive polymer bridges in FIG. 3. The numerals have the following meanings.
Figure 4B:
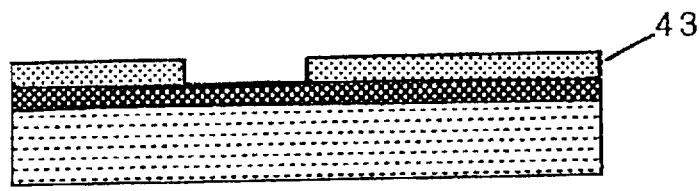
Figure 4C:
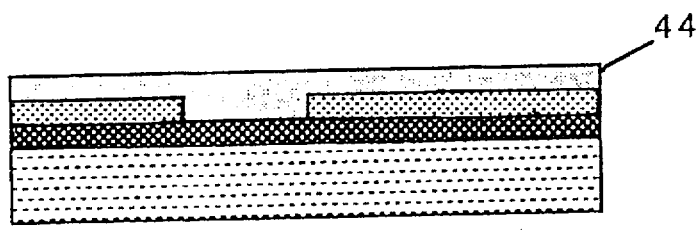
Figure 4D:
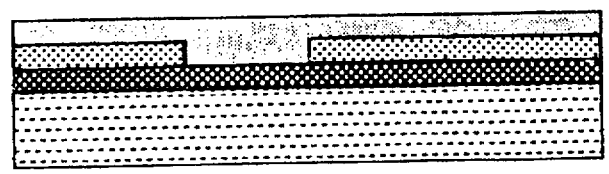
Figure 4E:
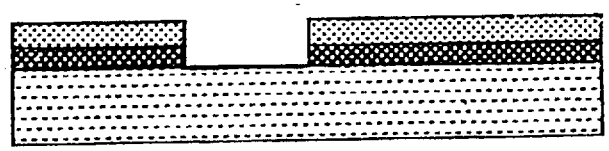
Figure 4F:
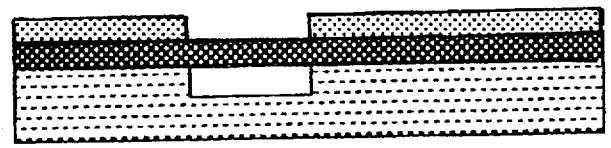
Figure 4G:
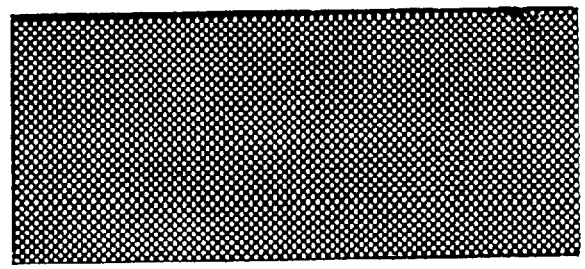
Figure 4H:
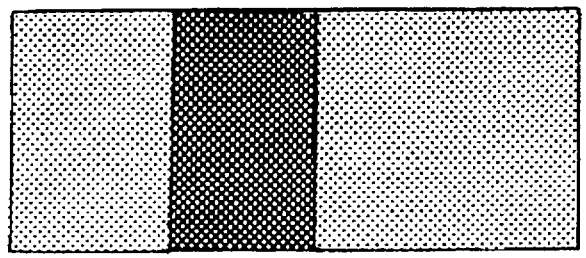
Figure 4I:
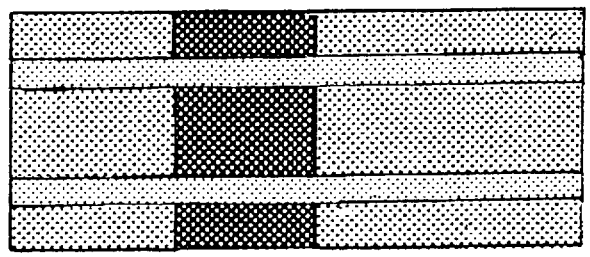
Figure 4J:
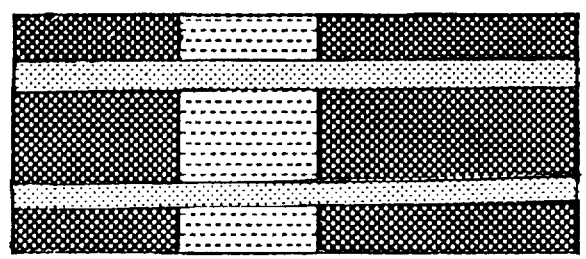
Figure 4K:
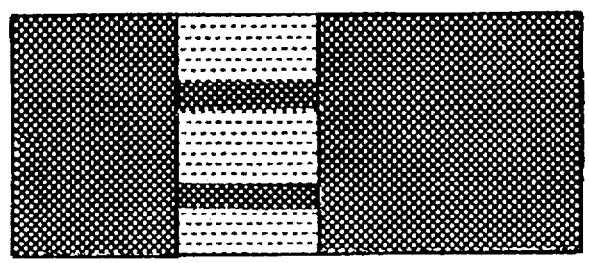

The process of creating the electrical devices shown in FIG. 1, FIG. 2, and FIG. 3 involves coating a polymer onto a substrate, then, if required, baking to remove the coating solvent. The polymer is ion implanted to induce conductivity. In some cases, such as in the use of copolymers of polystyrene and acrylonitrile, a post-implant annealing step improves the resistance stability of the film.

If it is preferred to pattern small features, the film is patterned by a standard lithographic technique (optical, electron beam, or x-ray lithography). The optical lithographic procedure involves spincoating or otherwise depositing photoresist on the conductive polymer film, and baking the photoresist at a temperature <120° C. to remove solvent. The photoresist is imaged with ultraviolet light through a mask. If positive photoresist is used, the image is developed with aqueous basic solution. The pattern is transferred to the conductive polymer film by reactive ion etching. The remaining photoresist is removed using acetone, or a commercial photoresist removal agent such as SafeStrip®. Electrical contacts can be evaporated or otherwise deposited on top of the film. Alternatively, the film can be coated on top of the electrical contacts and, provided that the film is thin enough, the contact resistance will be negligible.

Many types of substrate can be used for the contact resistors. Preferred substrates for contact resistor-type devices are inorganic insulators such as glass, silicon dioxide, silicon nitride, alumina, or any surface which has sufficient flatness as determined by the size of the patterned features. The preferred substrate for fabrication of the freestanding bridge is silicon, on which a layer of silicon dioxide has been coated. Bridges can also be formed on glass microscope slides, although the surface quality of the etched glass is not as high as that of the silicon surface. Flexible substrates which are insulating polymers can also be used for some devices, such as polyimide, polyester, or other types of polymer freestanding films. In the case of flexible polymer films, the films can be attached to an inflexible substrate in order to maintain rigidity during spincoating.

Preferred polymers for implantation are copolymers of styrene with nitrile-containing acrylic polymers such as polyacrylonitrile or polymethacrylonitrile, but depending on the desired properties of the resulting film, other acrylic-backbone polymers having pendant nitrile, styrene or ester groups which can be conveyed in an organic solvent or water can be used. These may include soluble acrylic polymers, polyethers, polyamides and polyimides and their precursors, polyesters, polyurethanes, polysulfones, polybenzocyclobutanes, phenol-formaldehyde resins, or soluble versions of polyaniline, or other intrinsically conductive polymers. While the term "polymer" is used throughout, it is understood that oligomers, thermosetting polymer precursors, or other organic compounds which can form a continuous, high-quality film can be employed. An especially unexpected discovery of this invention is the ability to employ non-polyimide polymers.

The polymer is coated on the desired substrate as a solvent or water solution with percent solids ranging from 2% to 75%, depending upon the solubility in solution, the molecular weight, and the desired thickness. If the film is to be lithographically patterned, the polymer solution should be filtered before use to remove particles; the extent of filtration depends upon the smallest feature size, and a filtration step in the range of 0.2 to 1 micrometer is standard. The polymers are applied to the substrate by any standard method which produces the required thickness and film quality (spincoating, spray coating, brushing, roller coating, casting, meniscus coating, or dipping). The preferred method is spincoating. The spin speed and polymer percent solids are adjusted to form the desired film thickness. The solvent is then evaporated, preferably by baking on a hot plate or in an oven at a temperature greater than 90° C.

If the films are to be lithographically patterned on an inflexible and nonporous substrate, the film thickness is an important parameter. Films which are too thick do not have the improved solvent resistance, and they can blister during the photoresist baking steps. In addition, the film thickness influences parameters such as ambient stability. The preferred film thickness (before implantation) for 35–75 keV implants is less than two times the mean implant range. For a poly(styrene-co-acrylonitrile) film to be implanted with 50 keV nitrogen ions, the optimal thickness is in the range of 1000 to 3000 angstroms. During the implantation process, films lose from 10% to 75% of their original thickness due to densification and sputtering.

The mean range of ions in the film can be estimated using computer simulations of the ion-induced damage during implantation; for instance, the TRIM program described by J. F. Zielger, J. P. Biersack, and U. Littmark (*The Stopping and Range of Ions in Solids*, Pergamon Press, Oxford, 1985). The mean range is a function of ion mass, ion energy, and polymer density. For 50 keV $N_2^+$ ions, the mean range is estimated as approximately 1500 angstroms.

To make the film conductive, it is ion implanted with positive ions. The conductivity is a strong function of the ion type and energy, the fluence, the beam current density, the polymer type, and polymer thickness. At 50 keV, fluences greater than $1 \times 10^{15}$ ions/cm$^2$ can be used, with the preferred fluence being greater than $1 \times 10^{16}$ ions/cm$^2$. Beam current density can range from 0.1 microamps/cm$^2$ to 10 microamps/cm$^2$, but it is preferable to keep current density low. Ion energy can range from 25 keV to 20 MeV. Ion types include, but are not limited to, positive ions of nitrogen, boron, arsenic, and carbon, or molecular ions such as $BF_2^+$ or $N_2^+$.

The film becomes semiconductive in the regions where it is implanted. The resistivity ranges widely, depending upon the implantation conditions. Optimum energies are in the range of 35 to 100 keV. The log of the resistance is a function of the reciprocal of the temperature. FIG. 5 shows a graph of the resistance as a function of temperature from room temperature to 50 Kelvin, immediately after implantation and after 1 month. The resistance-temperature behavior is highly reproducible and retraceable.

The ambient stability of PSA films implanted with the conditions listed above can be improved through a post-implantation anneal step of 100° to 200° C. oven bake for 2 to 300 hours.

Implanted thin films have high resistance to abrasion and show little change upon exposure to moisture, solvent, acids, or bases. The physical properties of the thin films, such as hardness, become similar to the substrate. The moisture, solvent, and abrasion resistance of thicker films is a function of the underlying polymer which has not been damaged by implantation.

In spite of the fact that the implanted films have a high degree of hardness, the conductive films can be patterned by lithography to form <2 micrometer size features. Photoresist processing procedures should be as recommended by the manufacturer. The patterned photoresist film is then used as an etch mask to transfer the pattern to the implanted film by a reactive ion etching process.

Appropriate metal leads can be patterned by a similar process to form the structures shown in FIGS. 1 and 2. Electrical contacts can consist of metals (such as nickel, copper, gold, titanium-tungsten, or the like), an inorganic semiconductor, or a conducting polymer or other methods of making electrical interconnections apparent to one skilled in the art.

Freestanding conductive polymer bridges are formed by fabricating the above-described structure on top of silicon dioxide-coated silicon wafers. After plasma etching of the contact resistor, the silicon dioxide is removed by dissolution in hydrofluoric etching solution. The wafer is rinsed in water and air dried.

Following the above processing of the conductive polymer devices, the wafers can be diced and packaged according to standard industry practices, the final package being dependent upon the intended application.

The ion implanted conducting polymer devices have a variety of applications in the integrated circuit industry as resistors and other electrical components. Their steep resistance-temperature response makes them useful as miniature temperature sensors or temperature sensing arrays, or in other types of devices where resistance changes can be used to monitor temperature.

The patterning capability enables the fabrication of highly uniform arrays of resistors or resistance-temperature transducers with close resistance and R-T tolerances. One six-inch silicon wafer can produce over 10,000 single packaged devices, each of 1 mm$^2$ area, enabling a low-cost method of producing very small, close-tolerance thermistors or other devices.

When a film of implanted PSA is exposed to a magnetic field of 3 kilogauss, the resistance does not change appreciably. This lack of magnetoresistance is an advantage over silicon diode temperature sensors, and other types of temperature sensors. The films also have a remarkable stability when subjected to high power densities and current densities on the order of 2000 Watts/cm$^2$ and 2000 amps/cm$^2$, respectively.

The high resistance-temperature response, low mass of the films, and their ability to be thermally isolated from the substrate, makes them applicable for infrared imaging. Arrays of ion-implanted temperature sensors could be used for mapping or infrared signals.

While specifically resistors are discussed here, the technology can be extended to include other types of electrical devices, as well as abrasion-resistant surfaces in micromachined devices.

EXAMPLE 1

A 7% solution of polystyrene-co-acrylonitrile (80/20 molar ratio) in diglyme was filtered to 0.2 micrometers, spincoated onto a glass microscope slide and the slide was baked on a hot plate at 168° C. for 2 minutes. The resulting film had a resistivity in excess of $10^{10}$ ohm-cm and had a film thickness of 2000 angstroms as measured by a surface profilometer. The film was then placed in an ion implanter and implanted with 50 keV $^{14}N^+$ ions, beam current density of 0.5 microamps/cm$^2$, and a fluence of $5 \times 10^{16}$ ions/cm$^2$. After removal from the implanter, the film had darkened and lost 45% of its original thickness and was not scratchable without scratching the substrate with a diamond scribe. Gold electrodes were evaporated on top of the film to provide electrodes with 7 mm gap. The surface resistivity as calculated from the electrode geometry and measured resistance was 35 megaohms/square.

The film had a negative temperature coefficient of resistance (resistance-temperature behavior shown in FIG. 5). Temperature resolution (assuming a 0.1% resistance change) was 0.07° C. at 300K. The resistance-temperature curve was highly stable, as shown in FIG. 5.

The film was coated with Shipley 1470J positive photoresist, exposed through a mask to UV light, and developed in positive photoresist developer (MF312). The developer removed photoresist in the exposed areas. The ion implanted polymer was then etched in a reactive ion plasma. One micrometer size lines were distinguished; the film retained its original bulk conductivity and temperature sensitivity. Wafers with 10–100 micrometer size features which were processed according to the same procedure were diced, wire bonded, and packaged into dual in-line packages (DIP chips) without degradation of the sheet resistance. A resistor element measuring approximately 20 microns square was subjected to a voltage of 90 volts for one hour with a less than 1% change in resistance. The current density in the implanted layer was estimated to be 2000 Amps/cm$^2$ and the power dissipated was approximately 2000 Watts/cm$^2$.

EXAMPLE 2–6

Films 1500 Angstroms thick of polystyrene-acrylonitrile were prepared and implanted as in Example 1, except that fluences ranging from $1 \times 10^{15}$ to $1 \times 10^{17}$ ions/cm$^2$ were used. The resistivity/temperature behavior as a function of fluence is shown in FIG. 6 and Table 1.A.

EXAMPLES 7–10

Films 2700 Angstroms thick of polystyrene-acrylonitrile were prepared and implanted as Example 1, except that fluences ranging from $5 \times 10^{15}$ to $1 \times 10^{17}$ ions/cm$^2$ were used. The resulting resistivities and aging rates are shown in Table 1.B.

EXAMPLES 11–16

Polystyrene-acrylonitrile and PMDA/ODA, a copoloymer of pyromellitic dianhydride and 4,4'-oxydianiline (0.95:1 mole ratio) were dissolved and spincoated to give films nominally 1900 Angstroms thick. The films were implanted as in Example 1, with the following implantation conditions: ion, $^{14}N^+$; energy, 50 kev; beam current density, 3.3 microamps/cm$^2$. The fluence was varied from $1\times10^{17}$ ions/cm$^2$ to $5\times10^{17}$ ions/cm$^2$. All polymers were insulating before implantation. Table 2 shows the final surface resistivities and aging rates after implantation.

EXAMPLES 17–20

Films of poly(styrene-co-acrylonitrile) (80/20) were prepared as above and implanted with various positive ions with the following conditions: initial nominal film thickness, 5000 Angstroms; energy, 50 keV; fluence, $1\times10^{16}$ ions/cm$^2$; beam current density, 0.5 microamps/cm$^2$. The surface resistivities and aging rates are shown in Table 3. The resistance-temperature behaviors followed the same general trend as the polymers in the previous examples, and are shown in FIG. 7.

EXAMPLES 21–23

Films of polystyrene-acrylonitrile were prepared and implanted as in Example 1, except that the film thicknesses were varied from 2000 Angstroms to 4000 Angstroms by varying the polymer/solvent ratios and spinning conditions. The resulting resistivities and aging rates are shown in Table 4.A.

EXAMPLES 24–29

Films of polystyrene-acrylonitrile were prepared and implanted as in Examples 21–23, except that the film thicknesses were varied from 500 Angstroms to 4000 Angstroms. The resulting resistivities and aging rates are shown in Table 4.B.

EXAMPLES 30–35

Polystyrene-acrylonitrile and PMDA/ODA, a copolymer of pyromellitic dianhydride and 4,4'-oxydianiline (0.95:1 mole ratio) were dissolved and spincoated to give films nominally 2000 Angstroms thick. Films were implanted as in Example 1 except that the ion energy was varied from 20 to 50 keV. The resulting resistivities and aging rates are shown in Table 5.

EXAMPLES 36–43

Polystyrene, polysulfone, poly(styrene-co-acrylonitrile) (80/20), poly(acrylonitrile-co-methyl methacrylate) (93/7), and polyamic acids were dissolved in suitable spinning solvents as shown in Table 6.A and spincoated to give films 2000 Angstroms thick. Types of polyamic acid used were: PMDA/ODA, a copolymer of pyromellitic dianhydride and 4,4'-oxydianiline (0.95:1 mole ratio); BTDA/ODA, a copolymer of 3,3',4,4'-benzophenone tetracarboxylic dianhydride and 4,4'-oxydianiline (0.95:1 mole ratio); BTDA/4APS, copolymer of 3,3', 4,4'-benzophenone tetracarboxylic dianhydride and 4,4'-aminophenyl sulfone (0.95:1 mole ratio); and a ter-polymer of 3,3',4,4'-benzophenone tetracarboxylic dianhydride, bis(aminophenyl phenoxy sulfone) and diaminobenzoic acid (1:0.75:0.25) mole ratios). Films were implanted as in Example 1, with the following implantation conditions: ion, $^{28}N_2^+$; energy, 50 keV; fluence, $1\times10^6$ ions/cm$^2$; beam current density, 0.5 microamps/cm$^2$; nominal film thickness, 2000 Angstroms. All polymers were insulating before implantation. Table 6.A shows the surface resistivities and aging rates after implantation.

EXAMPLES 44–55

Polystyrene; various copolymers of styrene and methacrylonitrile with mole ratios of 64/31, 54/46, and 28/72; polymethacrylonitrile; poly(styrene-co-acrylonitrile) (70/30); poly(vinylidene chloride-co-acrylonitrile) (80/20); poly (methylmethacrylate); and two thermal curing oligomers, benzocyclobutane and fluorinated benzocyclobutane were spincoated to give films nominally 2000 Angstroms thick. The polymers were all dissolved in cyclohexanone. The thermal curing oligomers were both cured and uncured prior to implantation. The films were all insulating before being implanted as in Example 1. The resistivity and aging rates after implantation are shown in in Table 6.B.

EXAMPLES 56–63

Films of polymers were prepared and implanted as in Examples 6–13. Gold leads were evaporated and wires were attached. Resistance was monitored while the samples were heated to 250° C. in air in an oven. Upon reaching the temperature of 250° C., the temperature was maintained for 60 minutes while resistance was measured.

Using the resistance-temperature behavior of each sample which was determined during the heat up cycle, an equivalent error in temperature reading from the beginning of the 250° hold to the end of the hold was calculated. This error corresponded to the resistance changes which occurred on aging at 250° C., and is shown in Table 7. Surprisingly, the thermal stability of the original, unimplanted polymer had little correlation with the thermal stability of the resistance of the implanted film. Softer polymers with less thermal stability in the original film had greater thermal stability of the resistance in the implanted, conductive form.

EXAMPLES 64–70

Films of polymers were prepared and implanted as in Example 20. Gold leads were evaporated and wires were attached. Resistance was monitored while the samples were heated to 120° C. in air on a hotplate. Upon reaching the temperature of 120° C., the temperature was maintained for 30 minutes while resistance was measured.

Table 8 shows the percentage change in resistance from the beginning and end of the heating cycle.

EXAMPLE 71

A phthalonitrile-terminated bisphenol resin was spincoated from cyclohexanone onto glass microscope slides and ion implanted with B+ at an energy of 50 keV and a fluence of $5\times10^{16}$ ions/cm$^2$. Aluminum electrodes were evaporated on top of the film, and the surface resistivity was measured to be 2 megaohms/square, with a beta value (slope of the plot of ln(R) versus 1/temperature) of 1500 K$^{-1}$. The film resistance at 25° changed by 0.9% (approximately the error due to temperature effects) after boiling in water for two minutes.

EXAMPLE 72

A microscope slide was spincoated and with polystyrene acrylonitrile and implanted as in Example 1. Gold was evaporated onto the slide to form electrical interconnections. The resistance was measured to be 17.85±0.05 Megaohms. The slide was soaked for 18 hours in propylene glycol monomethylether acetate, a strong solvent for unimplanted polystyrene acrylonitrile. Surprisingly, the film appearance was unchanged after the prolonged soak and the resistance measured afterwards was 17.8±0.05 Megaohms.

TABLE 1.A

Fluence Dependence of Resistivities and Aging Rates
Poly(sytrene-co-acrylonitrile, 80,20)
1500 Å, 50 keV $^{14}N^+$ 0.5 μA/cm$^2$

| Example | Fluence ion/cm$_2$ | Ry Mohms/square | Aging Rate %/100 hours |
|---|---|---|---|
| 2 | $1 \times 10^{15}$ | 6760 | 2.8 |
| 3 | $5 \times 10^{15}$ | 771 | 1.9 |
| 4 | $1 \times 10^{16}$ | 55 | 1.7 |
| 5 | $5 \times 10^{16}$ | 7 | 0.5 |
| 6 | $1 \times 10^{17}$ | 9 | 0.5 |

TABLE 1.B

Fluence Dependence of Resistivities and Aging Rates
Poly(sytrene-co-acrylonitrile, 80,20)
2700 Å, 50 keV $^{14}N^+$ 0.5 μA/cm$^2$

| Example | Fluence ion/cm$_2$ | Ry Mohms/square | Aging Rate %/100 hours |
|---|---|---|---|
| 7 | $5 \times 10^{15}$ | 1973 | 5.0 |
| 8 | $1 \times 10^{16}$ | 99 | 4.8 |
| 9 | $5 \times 10^{16}$ | 68 | 1.3 |
| 10 | $1 \times 10^{17}$ | 42 | 1.7 |

TABLE 2

High Fluence Dependence of Resistivities and Aging Rates
(1900 Å, 50 keV $^{14}N^+$, 3.3 μA/cm$^2$)

| Example | Fluence ions/cm$^2$ | Polymer | Ry Mohms/square | Aging Rate %/100 hours |
|---|---|---|---|---|
| 11 | $1 \times 10^{17}$ | PSA | 16.0 | 1.14 |
| 12 | $2 \times 10^{17}$ | PSA | 14.5 | 2.5 |
| 13 | $5 \times 10^{17}$ | PSA | 2.3 | 3.4 |
| 14 | $1 \times 10^{17}$ | PMDA/ODA | 2.2 | 0.81 |
| 15 | $2 \times 10^{17}$ | PMDA/ODA | 2.9 | 0.74 |
| 16 | $5 \times 10^{17}$ | PMDA/ODA | 2.2 | 4.1 |

TABLE 3

Ion Species Dependence of Resistivities and Aging Rates
Poly(styrene-co-acrylonitrile, 80,20)
5000 Å, 50 keV, $1 \times 10^{16}$/cm$^2$, 0.5 μA/cm$^2$

| Example | Ion Species | Ry Mohms/square | Aging Rate %/100 hours |
|---|---|---|---|
| 17 | $^{11}B^+$ | 1753 | 12 |
| 18 | $^{19}F^+$ | 974 | 6 |
| 19 | $^{49}BF_2^+$ | 269 | 6 |
| 20 | $^{75}As^+$ | 1558 | 8 |

TABLE 4.A

Thickness Dependence of Resistivities and Aging Rates
Poly(styrene-co-acrylonitrile, 80,20)
50 keV $^{14}N^{+,\ 5 \times 10^{16}}$/cm$^2$, 0.5 μA/cm$^2$

| Example | Thickness | Ry Mohms/square | Aging Rate %/100 hours |
|---|---|---|---|
| 21 | 2000 Å | 13.4 | 0.53 |
| 22 | 3000 Å | 132 | 4.1 |
| 23 | 4000 Å | 157 | 4.6 |

TABLE 4.B

Thickness Dependence of Resistivities and Aging Rates
Poly(styrene-co-acrylonitrile, 80,20)
50 keV $^{14}N^{+,\ 5 \times 10^{15}}$/cm$^2$, 0.5 μA/cm$^2$

| Example | Thickness | Ry Mohms/square | Aging Rate %/100 hours |
|---|---|---|---|
| 24 | 500 Å | 3937 | 4 |
| 25 | 1000 Å | 1942 | 3.6 |
| 26 | 1500 Å | 1419 | 3.7 |
| 27 | 2000 Å | 1651 | 3.9 |
| 28 | 3000 Å | 2087 | 4.1 |
| 29 | 4000 Å | 2090 | 4.1 |

TABLE 5

Ion Energy Dependence of Resistivities and Aging Rates
2000 Å, $^{14}N^{+,\ 5 \times 10^{16}}$/cm$^2$, 0.5 μA/cm$^2$

| Example | Polymer | Ion Energy Key | Ry Mohms/square | Aging Rate %/100 hours |
|---|---|---|---|---|
| 30 | PSA | 20 | 1807 | 2.1 |
| 31 | PSA | 35 | 191 | 2.2 |
| 32 | PSA | 50 | 40 | 0.5 |
| 33 | PMDA/ODA | 20 | 715 | 9.5 |
| 34 | PMDA/ODA | 35 | 19 | 2.3 |
| 35 | PMDA/ODA | 50 | 5.1 | 0.5 |

TABLE 6.A

Polymer Dependence of Resistivities and Aging Rates
2000 Å, 50 keV, $^{28}N_2^{+,\ 1 \times 10^{16}}$/cm$^2$, 0.5 μA/cm$^2$

| Example | Polymer(solvent) | Ry Mohms/square | Aging Rate %/100 hours |
|---|---|---|---|
| 36 | Polystyrene (diglyme) | 2100 | 1.4 |
| 37 | Polysulfone (cyclohexanone/diglyme) | 610 | 2.7 |
| 38 | Poly(styrene-co-acrylonitrile) (80/20) (diglyme) | 118 | 1.1 |
| 39 | BTDA/ODA (0.95/1) (diglyme) | 55 | 4.9 |
| 40 | BTDA/4APS (0.95/1) (N-methylpyrrolidone) | 43 | 5.4 |
| 41 | Poly(acrylonitrile-co-MMA) (93/7) (NMP/cyclohexanone) | 29 | 5.3 |
| 42 | BTDA/BAPS/DABA (1/0.75/0.25) (NMP) | 22 | 3.0 |
| 43 | PMDA/ODA (0.95/1) (NMP) | 21 | 6.9 |

TABLE 6.B

Polymer Dependence of Resistivities and Aging Rates
2000 Å, 50 keV, $^{14}N^{+,\ 5 \times 10^{16}}$/cm$^2$, 0.5 μA/cm$^2$

| Example | Polymer | Ry Mohms/square | Aging Rate %/100 hours |
|---|---|---|---|
| 44 | Polystyrene | 66.8 | 1 |
| 45 | Poly(styrene-co-methacrylonitrile) (64/31) | 38 | 1.1 |
| 46 | Poly(styrene-co-methacrylonitrile) (54/46) | 26 | 1.2 |
| 47 | Poly(styrene-co-methacrylonitrile) (28/72) | 16 | 1.2 |
| 48 | Polymethracrylonitrile | 6.2 | 1.2 |

TABLE 6.B-continued

Polymer Dependence of Resistivities and Aging Rates
2000 Å, 50 keV, $^{14}N^{+}$, $5 \times 10^{16}$/cm², 0.5 μA/cm²

| Example | Polymer | Ry Mohms/square | Aging Rate %/100 hours |
|---|---|---|---|
| 49 | Poly(styrene-co-acrylonitrile) (70/30) | 26 | 2.8 |
| 50 | Poly(vinlyidene chloride-co-acrylonitrile) | 8.3 | 5.7 |
| 51 | Poly(methyl methacrylate) | 44 | 0.9 |
| 52 | Benzocyclobutane uncured | 679 | 5.1 |
| 53 | Benzocyclobutane cured | 259 | 2.9 |
| 54 | Fluorinated Benzocyclobutane uncured | 13.3 | 10 |
| 55 | Fluorinated Benzocyclobutane cured | 8.1 | 2.5 |

TABLE 7

Apparent Error in Temperature Reading Due to Heating
2000 Å, 50 keV, $^{28}N_2^{+}$, $1 \times 10^{16}$/cm², 0.5 μA/cm²

| Example | Polymer | Tg(°C.) | Error* |
|---|---|---|---|
| 56 | Poly(styrene-co-acrylonitrile) (80/20) | 110 | <1° |
| 57 | Polystyrene | 93 | 5° |
| 58 | Polysulfone | 190 | 6° |
| 59 | Poly(acrylonitrile-co-MMA) (93/7) | 90 | 27° |
| 60 | PTDA/BAPS/DABA (1/0.75/0.25) | | 37° |
| 61 | PMDA/ODA (0.95/1) | 400 | 38° |
| 62 | BTDA/ODA (0.95/1) | 300 | 71° |
| 63 | BTDA/4APS (0.95/1) | 300 | 98° |

TABLE 8

% Change in Resistance of Ion Implanted Polymers
Following Heating at 120° in Air
2000 Å, 50 keV, $^{28}N_2^{+}$, $1 \times 10^{16}$ ions/cm², 0.5 μA/cm²

| Example | Polymer | Tg(°C.) | % Change |
|---|---|---|---|
| 64 | Polystyrene | 93 | 0.5% |
| 65 | Poly(styrene-co-acrylonitrile) (80/20) | 110 | 5% |
| 66 | Poly(acrylonitrile-co-MMA) (93/7) | 90 | 9% |
| 67 | BTDA/4APS (0.95/1) | 300 | 16% |
| 68 | Polysulfone | 190 | 17% |
| 69 | PMDA/ODA (0.95/1) | 400 | 20% |
| 70 | BTDA/ODA (0.95/1) | 300 | 25% |

What is claimed is:

1. An improved method of making electrical components, said method comprising a. coating an organic material onto a substrate to achieve a continuous film with a high degree of surface uniformity, said film having a thickness less than two times a mean ion implant range of from 100 Å to 50 micrometers:

b. implanting the film with ions at said mean implant range in order to induce electrical conductivity, specified by a measured resistivity of less than $10^{10}$ ohms/square, and ion-energy of from 25 KeV to 20 MeV;

c. photolithographically patterning the resulting conductive film on top of metal electrodes, followed by etching of the substrate underneath the implanted film to reveal a bridge structure which is supported only on the ends of the bridge by the metal electrodes.

* * * * *